United States Patent
Saitou et al.

(10) Patent No.: US 8,501,392 B2
(45) Date of Patent: Aug. 6, 2013

(54) PHOTOSENSITIVE ELEMENT, METHOD FOR FORMATION OF RESIST PATTERN, AND METHOD FOR PRODUCTION OF PRINT CIRCUIT BOARD

(75) Inventors: Manabu Saitou, Hitachi (JP); Junichi Iso, Hitachi (JP); Tatsuya Ichikawa, Hitachi (JP); Takeshi Ohashi, Hitachi (JP); Hanako Yori, Hitachi (JP); Masahiro Miyasaka, Hitachi (JP); Takashi Kumaki, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 365 days.

(21) Appl. No.: 12/297,448

(22) PCT Filed: Apr. 13, 2007

(86) PCT No.: PCT/JP2007/058159
§ 371 (c)(1), (2), (4) Date: Feb. 12, 2009

(87) PCT Pub. No.: WO2007/123062
PCT Pub. Date: Nov. 1, 2007

(65) Prior Publication Data
US 2009/0297982 A1    Dec. 3, 2009

(30) Foreign Application Priority Data

Apr. 18, 2006 (JP) .................................. 2006 114406
Aug. 28, 2006 (JP) .................................. 2006 231128

(51) Int. Cl.
*G03F 7/004* (2006.01)
*G03F 7/028* (2006.01)
*G03F 7/26* (2006.01)
*G03F 7/11* (2006.01)
*G03F 7/032* (2006.01)

(52) U.S. Cl.
USPC ............... 430/286.1; 430/270.1; 430/281.1; 430/270.15; 430/905; 430/913; 430/945; 430/271.1; 430/273.1; 430/315; 430/325; 430/915

(58) Field of Classification Search
USPC ............. 430/270.1, 270.15, 273.1, 311, 905, 430/913, 315, 915, 281.1, 286.1, 945
See application file for complete search history.

(56) References Cited

U.S. PATENT DOCUMENTS 5,935,761 A * 8/1999 Hwang et al. ............... 430/281.1
7,067,228 B2 * 6/2006 Kimura et al. .............. 430/270.1
(Continued)

FOREIGN PATENT DOCUMENTS

CN    1435730    8/2003
CN    1639641    7/2005
(Continued)

OTHER PUBLICATIONS

English langauge translation of JP 05-179226 (no date).*
(Continued)

*Primary Examiner* — Amanda C. Walke
(74) *Attorney, Agent, or Firm* — Antonelli, Terry, Stout & Kraus, LLP.

(57) ABSTRACT

A photosensitive element comprises a support, a photosensitive layer and a protective film laminated in that order, wherein the photosensitive layer is composed of a photosensitive resin composition containing a binder polymer, a photopolymerizing compound, a photopolymerization initiator and a compound with a maximum absorption wavelength of 370-420 nm, and the protective film is composed mainly of polypropylene.

10 Claims, 1 Drawing Sheet

U.S. PATENT DOCUMENTS

| | | | |
|---|---|---|---|
| 7,645,561 B1 * | 1/2010 | Kimura et al. | 430/273.1 |
| 2006/0051703 A1 | 3/2006 | Kimura | |
| 2009/0029289 A1 * | 1/2009 | Miyasaka et al. | 430/285.1 |

FOREIGN PATENT DOCUMENTS

| | | | |
|---|---|---|---|
| EP | 1 205 802 A1 | | 5/2002 |
| EP | 1 553 449 | | 7/2005 |
| JP | 05179226 A | * | 7/1993 |
| JP | 10-110008 | | 4/1998 |
| JP | 11-153861 | | 6/1999 |
| JP | 2000-330291 | | 11/2000 |
| JP | 2002-296764 | | 10/2002 |
| JP | 2004-348114 | | 12/2004 |
| JP | 2005-208070 | | 8/2005 |
| JP | 2005-215142 | | 8/2005 |
| JP | 2006-071916 | | 3/2006 |

OTHER PUBLICATIONS

English language translation of JP 2000-330291 (no date).*
English langage translation of JP 2005-208070 (no date).*
English language translation of JP 2004-348114 (no date).*
Translation of the International Preliminary Report on Patentability dated Nov. 27, 2008, for Application No. PCT/JP2007/058159.
Notification of Information Provision, dated Feb. 23, 2010, for Application No. 2008-512095.
Supplementary European Search Report dated Aug. 8, 2011, for European Patent Application 07741595.8; 12 pages; European Patent Office; Munich, Germany.
Office Action dated Feb. 28, 2011, Patent Application No. 200780013593.3, 7 pages, Chinese Patent Office, The People's Republic of China.
Communication dated Dec. 18, 2012, in connection with Taiwanese Patent Application No. 096113369, 6 pages, Taiwanese Patent Office, Taiwan.
Communication mailed Mar. 14, 2013, in connection with Chinese Patent Application No. 201210142249.7, 24 pages, Chinese Patent Office, Republic of China.

* cited by examiner

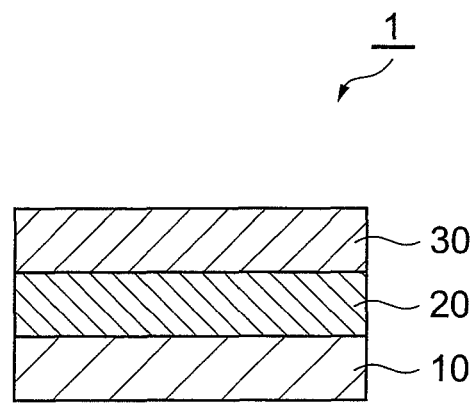

PHOTOSENSITIVE ELEMENT, METHOD FOR FORMATION OF RESIST PATTERN, AND METHOD FOR PRODUCTION OF PRINT CIRCUIT BOARD

TECHNICAL FIELD

The present invention relates to a photosensitive element, to a resist pattern forming method and to a printed circuit board production process.

BACKGROUND ART

Photosensitive elements are widely used as resist materials for etching and plating in the field of printed circuit board manufacturing. Photosensitive elements are usually obtained by forming a photosensitive layer composed of a photosensitive resin composition on a support and forming a protective film on the photosensitive layer. Photosensitive elements can be used to form resist patterns in the following manner. First, the protective film of the photosensitive element is released and the photosensitive layer is laminated on a board (copper board). Next a patterned phototool is contact bonded to the support, irradiated (exposed) with active light rays such as ultraviolet rays, and then sprayed with a developing solution to remove the unexposed sections.

With the increasing high densities and high definitions of printed circuit boards in recent years, demand has been growing for photosensitive elements with higher resolution and adhesiveness. Higher sensitivity is also being demanded of photosensitive elements for improved productivity of printed circuit boards. It has been attempted to improve the properties of photosensitive resin compositions in order to meet such demands (see Patent document 1).

On the other hand, there is also increasing interest in resist pattern forming methods based on "direct writing exposure", which involve direct writing without using phototools. It is generally accepted that direct writing exposure methods allow formation of resist patterns with high productivity and high resolution. Laser direct writing exposure and DLP (Digital Light Processing) exposure methods may be mentioned as typical direct writing exposure methods. In laser direct writing exposure, it has become practical to implement gallium nitride-based blue laser light sources that emit laser light with a wavelength of 405 nm, and that have long life and high output. The use of such short wavelength laser light for direct writing exposure is expected to allow formation of high-density resist patterns that have been difficult to produce in the prior art. DLP exposure, a process employing the DLP system advocated by Texas Instruments, has been proposed by Ball Semiconductor Co., and exposure devices that apply this process have already begun to be implemented.

The photosensitive element described in Patent document 1 is designed for total wavelength exposure by a mercury lamp light source, centered on light with a wavelength of 365 nm. Consequently, the sensitivity of the photosensitive element for exposure light (for example, violet semiconductor lasers centered on light with a wavelength of 405 nm) in direct writing exposure is low, making it difficult to adequately improve productivity. A photosensitive element has also been proposed that contains a hexaarylbiimidazole compound and titanocene compound as radical generators and a dialkylaminobenzene compound as a sensitizing dye (see Patent document 2).

[Patent document 1] Japanese Patent Application Laid-open HEI No. 10-110008
[Patent document 2] Japanese Patent Application Laid-open No. 2002-296764

DISCLOSURE OF THE INVENTION

Problems to be Solved by the Invention

Even the photosensitive element described in Patent document 2, however, does not have sufficient sensitivity for exposure light in direct writing exposure methods.

It is an object of the present invention to provide a photosensitive element that has sufficiently high sensitivity for exposure light in direct writing exposure methods.

Means for Solving the Problems

The photosensitive element of the invention comprises a support, a photosensitive layer and a protective film laminated in that order, wherein the photosensitive layer is composed of a photosensitive resin composition containing a binder polymer, a photopolymerizing compound, a photopolymerization initiator and a compound with a maximum absorption wavelength of 370-420 nm, and the protective film is composed mainly of polypropylene.

Another mode of the photosensitive element of the invention comprises a support, a photosensitive layer and a protective film laminated in that order, wherein the photosensitive layer is composed of a photosensitive resin composition containing a binder polymer, a photopolymerizing compound, a photopolymerization initiator and a sensitizing agent represented by the following general formula (1), (2) and/or (3), and the protective film is composed mainly of polypropylene.

[Chemical Formula 1]

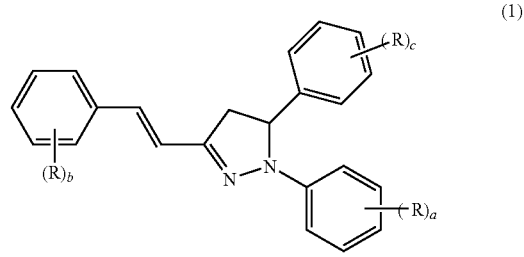

(1)

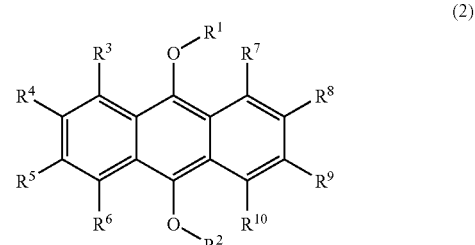

(2)

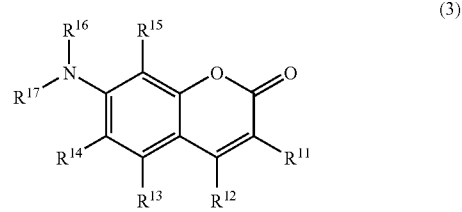

(3)

In formula (1), each R independently represents a C4-12 alkyl group, and a, b and c each independently represent an integer of 0-2 selected so that the total of a, b and c is 1-6. In formula (2), $R^1$ and $R^2$ each independently represent a C1-20 alkyl, C5-12 cycloalkyl, phenyl, benzyl, C2-12 alkanoyl or benzoyl group, and $R^3$, $R^4$, $R^5$, $R^6$, $R^7$, $R^8$, $R^9$ and $R^{10}$ (hereinafter referred to as "$R^3$-$R^{10}$") each independently represent hydrogen, C1-12 alkyl, a halogen atom, cyano, carboxyl, phenyl, C2-6 alkoxycarbonyl or benzoyl. When the aforementioned C1-20 alkyl group is a C2-12 alkyl group, it may have an oxygen atom between the main chain carbon atoms, and may be substituted with hydroxyl. The C5-12 cycloalkyl group may have an oxygen atom in the ring and may be substituted with hydroxyl. The phenyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups. A benzyl group may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups. The benzoyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups. In formula (3), $R^{16}$ and $R^{17}$ each independently represent hydrogen or a C1-3 alkyl group, $R^{11}$, $R^{12}$, $R^{13}$, $R^{14}$ and $R^{15}$ each independently represent optionally substituted C1-3 alkyl, hydrogen, trifluoromethyl, carboxyl, carboxylic acid ester, hydroxyl or thiol, and $R^{11}$, $R^{12}$, $R^{13}$, $R^{14}$, $R^{15}$, $R^{16}$ and $R^{17}$ (hereinafter referred to as "$R^{12}$-$R^{17}$") may bond together to form a cyclic structure.

The aforementioned specific combination in the photosensitive element of the invention results in sufficiently high sensitivity for light having a peak in the wavelength range of 390 nm-440 nm. In direct writing exposure, light with a peak in the wavelength range of 390 nm-440 nm is used as the active light rays.

The reason for this effect is not thoroughly understood, but the present inventors offer the following conjecture. Because conventional photosensitive resin compositions have maximum absorption wavelengths near 365 nm, light with a peak in the wavelength range of 390 nm-440 nm is located at the fringe of the absorbance peak of the photosensitive resin composition. Shifting the wavelength of the irradiated light by several nm, therefore, significantly alters the sensitivity. On the other hand, the maximum absorption wavelengths of the sensitizing agents represented by general formulas (1), (2) and (3) are all in the wavelength range of 370 nm-420 nm, thus allowing them to satisfactorily accommodate shifts of a few nm in the irradiated light wavelength. Also, it is believed that the protective film of the invention adequately inhibits permeation of oxygen gas into the photosensitive layer, thus sufficiently preventing oxygen inhibition of the photopolymerization initiator. However, this is not necessarily the only reason.

The photosensitive element of the invention preferably employs a combination of a sensitizing agent represented by general formula (1), (2) and/or (3), a 2,4,5-triarylimidazole dimer as a photopolymerization initiator, and a protective film composed mainly of a polypropylene film. Such a combination allows formation of resist patterns with sufficiently high sensitivity and high density even when using a laser such as a blue laser for the active light rays. It is therefore possible to efficiently produce printed circuit boards with high density and high definition even by direct writing exposure methods.

Each R in general formula (1) above independently is preferably one or more selected from the group consisting of n-butyl, tert-butyl, tert-octyl and dodecyl. The compound represented by general formula (1) is more preferably 1-phenyl-3-(4-t-butylstyryl)-5-(4-t-butylphenyl)pyrazoline. By using the aforementioned compound as the sensitizing agent represented by general formula (1), it is possible to further improve the sensitivity of the photosensitive element.

$R^1$ and $R^2$ in general formula (2) each independently represent a C1-4 alkyl group, and $R^3$-$R^{10}$ are preferably hydrogens. The compound represented by general formula (2) is more preferably 9,10-dibutoxyanthracene. By using the above compound as the sensitizing agent represented by general formula (2), it is possible to further improve the sensitivity of the photosensitive element.

The compound represented by general formula (3) is preferably 7-diethylamino-4-methylcoumarin. By using the above compound as the sensitizing agent represented by general formula (3), it is possible to further improve the sensitivity of the photosensitive element.

A preferred photopolymerization initiator is 2,4,5-triarylimidazole dimer, from the viewpoint of further improving the adhesiveness and sensitivity.

The density of fisheyes with diameters of 80 μm or larger in the protective film is preferably no greater than $5/m^2$. If the density of fisheyes with diameters of 80 μm or larger exceeds $5/m^2$, the sensitivity of the photosensitive layer and the adhesiveness of the resist pattern will tend to be lower. The density of fisheyes is the number of fisheye-shaped contaminants per unit area (1 $m^2$) of the protective film.

The thickness of the protective film is preferably 5-50 μm. If the thickness of the protective film is less than 5 μm the sensitivity of the photosensitive layer and the adhesiveness of the resist pattern will tend to be lower, and the protective film will tend to tear more easily when the protective film is released during use of the photosensitive element. On the other hand, a thickness of greater than 50 μm will tend to increase the cost of the photosensitive element.

The resist pattern forming method of the invention comprises a lamination step in which the photosensitive layer is laminated onto a circuit-forming board while releasing the protective film of the photosensitive element from the photosensitive layer, an exposure step in which prescribed sections of the laminated photosensitive layer are irradiated with active light rays, and a developing step in which the photosensitive layer that has been irradiated with active light rays is developed to form a resist pattern.

According to the resist pattern forming method of the invention, it is possible to form high density resist patterns on circuit-forming boards with high productivity.

The printed circuit board production process of the invention comprises a lamination step in which the photosensitive layer is laminated onto a circuit-forming board while releasing the protective film of the photosensitive element from the photosensitive layer, an exposure step in which prescribed sections of the laminated photosensitive layer are irradiated with active light rays, a developing step in which the photosensitive layer that has been irradiated with active light rays is developed to form a resist pattern, and a conductor pattern-forming step in which a conductor pattern is formed by etching or plating the circuit-forming board on which the resist pattern has been formed.

According to the printed circuit board production process of the invention, it is possible to form high density conductor patterns on circuit-forming boards with high productivity.

Effect of the Invention

According to the invention it is possible to provide a photosensitive element with sufficiently high sensitivity without impairing resolution or adhesiveness, even with the exposure light of direct writing exposure methods.

BRIEF DESCRIPTION OF THE DRAWINGS

FIG. 1 is a schematic cross-sectional view showing a preferred embodiment of a photosensitive element of the invention.

EXPLANATION OF SYMBOLS

1: Photosensitive element, 10: support, 20: photosensitive layer, 30: protective film.

BEST MODES FOR CARRYING OUT THE INVENTION

Preferred embodiments of the invention will now be explained in detail, with reference to the accompanying drawings as necessary. Identical elements in the drawings will be referred to by like reference numerals and will be explained only once. The vertical and horizontal positional relationships are based on the positional relationships in the drawings, unless otherwise specified. Also, the dimensional proportions depicted in the drawings are not necessarily limitative. Throughout the present specification, the term "(meth)acrylic acid" refers to "acrylic acid" and its corresponding "methacrylic acid", "(meth)acrylate" refers to "acrylate" and its corresponding "methacrylate", "(meth)acryloxy" refers to "acryloxy" and its corresponding "methacryloxy", and "(meth)acryloyl" refers to "acryloyl" and its corresponding "methacryloyl".

The photosensitive element of the invention comprises a support, a photosensitive layer and a protective film laminated in that order, wherein the photosensitive layer is composed of a photosensitive resin composition containing a binder polymer, a photopolymerizing compound, a photopolymerization initiator and a sensitizing agent represented by the above general formula (1), (2) and/or (3), and the protective film is composed mainly of polypropylene.

The photosensitive element of the invention is preferably used to form a resist pattern by exposure to light with a peak in the wavelength range of 390 nm-440 nm. By performing direct writing exposure using light with a peak in the wavelength range of 390 nm-440 nm as the active light rays it is possible to easily form a high-density resist pattern, and the photosensitive element of the invention has sufficiently high sensitivity for formation of resist patterns by light in this specified wavelength range.

FIG. 1 is a schematic cross-sectional view showing a preferred embodiment of a photosensitive element of the invention. The photosensitive element 1 in FIG. 1 comprises a support 10, photosensitive layer 20 and protective film 30 laminated in that order. The photosensitive layer 20, protective film 30 and support 10 will now be explained in order.

The photosensitive layer 20 is a layer composed of a photosensitive resin composition comprising a binder polymer, a photopolymerizing compound, a photopolymerization initiator and a sensitizing agent.

As examples for the binder polymer there may be mentioned acrylic-based resins, styrene-based resins, epoxy-based resins, amide-based resins, amide/epoxy-based resins, alkyd-based resins, phenol-based resins and the like. These may be used as single compounds or as combinations of two or more compounds. Acrylic-based resins are preferably used for their superior alkali developing properties.

The binder polymer may be produced, for example, by radical polymerization of a polymerizable monomer. As examples of such polymerizable monomers there may be mentioned styrene, polymerizable styrene derivatives substituted at the α-position or on the aromatic ring such as vinyltoluene and α-methylstyrene, acrylamides such as diacetoneacrylamide, acrylonitrile, vinyl alcohol esters such as vinyl-n-butyl ether, (meth)acrylic acid alkyl esters, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chlor(meth)acrylic acid, β-furyl(meth)acrylic acid, β-styryl(meth)acrylic acid, maleic acid, maleic acid monoesters such as maleic anhydride, monomethyl malate, monoethyl malate and monoisopropyl malate, and fumaric acid, cinnamic acid, α-cyanocinnamic acid, itaconic acid, crotonic acid, propiolic acid and the like. These polymerizable monomers may be used as single compounds or as combinations of two or more compounds.

As examples of (meth)acrylic acid alkyl esters there may be mentioned compounds represented by the following general formula (4), and the same compounds with the alkyl groups substituted with hydroxyl groups, epoxy groups, halogen atoms or the like.

[Chemical Formula 2]

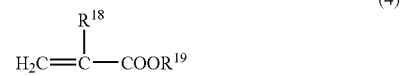

(4)

In formula (4), $R^{18}$ represents hydrogen or a methyl group, and $R^{19}$ represents a C1-12 alkyl group. As examples of C1-12 alkyl groups there may be mentioned methyl, ethyl, propyl, butyl, pentyl, hexyl, heptyl, octyl, nonyl, decyl, undecyl, dodecyl and their structural isomers.

As examples of compounds represented by general formula (4) there may be mentioned methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, undecyl (meth)acrylate and dodecyl (meth)acrylate. These may be used as single compounds or as combinations of two or more compounds.

The binder polymer preferably contains a carboxyl group from the viewpoint of achieving more satisfactory alkali developing properties. The binder polymer may be obtained, for example, by radical polymerization of a carboxyl group-containing polymerizable monomer with another polymerizable monomer. From the viewpoint of further improving the flexibility, the binder polymer also preferably contains styrene or a styrene derivative as a polymerizable monomer. When styrene or a styrene derivative is used as a copolymerizing component, the content of the styrene or styrene derivative is preferably 0.1-30 wt %, more preferably 1-28 wt % and most preferably 1.5-27 wt % based on the total amount of copolymerizing components, in order to achieve satisfactory adhesiveness and release properties. If the content is less than 0.1 wt % the adhesiveness will tend to be inferior, and if it is greater than 30 wt % the release strip will be larger, tending to lengthen the release time.

The binder polymer has a degree of dispersion (weight-average molecular weight/number-average molecular weight) of preferably 1.0-6.0 and more preferably 1.0-3.0. A dispersibility of greater than 6.0 will tend to lower the adhesiveness and resolution. The weight-average molecular weight and number-average molecular weight for this embodiment are measured by gel permeation chromatography (GPC) and expressed in terms of standard polystyrene as the reference sample.

The weight-average molecular weight of the binder polymer (based on standard polystyrene measured according by gel permeation chromatography (GPC)) is preferably 20,000-300,000, more preferably 40,000-150,000 and even more preferably 40,000-80,000. A weight-average molecular weight of less than 20,000 will tend to result in lower developing solution resistance, and greater than 300,000 will tend to lengthen the developing time.

Such binder polymers may be used alone or in combinations of two or more. When two or more different polymers are used in combination, they may be, for example, two or more copolymers with different copolymerizing components, two or more polymers with different weight-average molecular weights, or two or more polymers with different degrees of dispersion.

The acid value of the binder polymer is preferably 100-500 mgKOH/g and more preferably 100-300 mgKOH/g. If the acid value is less than 100 mgKOH/g the developing time will tend to be longer, and if it is greater than 500 mgKOH/g the developing solution resistance of the photocured photosensitive layer will tend to be reduced.

The photopolymerizing compound may be any one that contains one or more ethylenic unsaturated bonds, and examples thereof include bisphenol A-based (meth)acrylate compounds. As preferred examples of bisphenol A-based (meth)acrylate compounds there may be mentioned compounds represented by the following general formula (5).

[Chemical Formula 3]

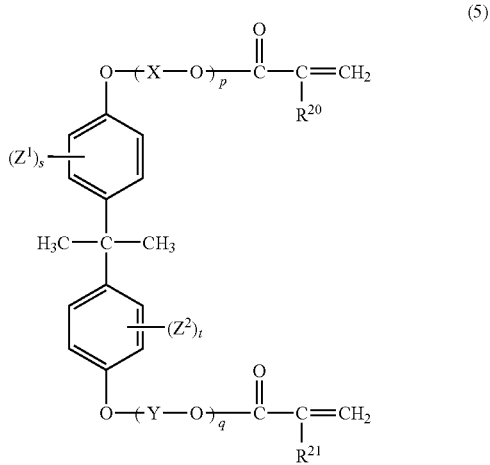

(5)

In general formula (5), $R^{20}$ and $R^{21}$ each independently represent hydrogen or methyl. X and Y each independently represent a C2-6 alkylene group. As C2-6 alkylene groups there may be mentioned ethylene, propylene, isopropylene, butylene, pentylene and hexylene. Of these, preferably X and Y each independently represent ethylene or propylene, and more preferably both are ethylene groups. Also, p and q are positive integers selected so that (p+q)=4-40, preferably 6-34, more preferably 8-30, even more preferably 8-28, yet more preferably 8-20, much more preferably 8-16 and most preferably 8-12. If (p+q) is less than 4 the compatibility with the binder polymer will tend to be lower, while if (p+q) is greater than 40 the hydrophilicity will tend to increase, resulting in a higher absorption percentage of the cured film. $Z^1$ and $Z^2$ each independently represent a halogen atom, C1-20 alkyl, C3-10 cycloalkyl, C6-18 aryl, phenacyl, amino, monoalkylamino or dialkylamino with a C1-20 alkyl group, nitro, cyano, carbonyl, mercapto, C1-10 alkylmercapto, allyl, hydroxyl, C1-20 hydroxyalkyl, carboxyl, carboxyalkyl with a C1-10 alkyl group, acyl with a C1-10 alkyl group, C1-20 alkoxy, C1-20 alkoxycarbonyl, C2-10 alkylcarbonyl, C2-10 alkenyl, C2-10 N-alkylcarbamoyl, or a heterocyclic ring-containing group, or an aryl group substituted with any of these groups as substituents. These substituents may also form fused rings. The hydrogens in these substituents may also be replaced by the aforementioned substituents, such as halogen atoms. If the number of substituents is two or more, the two or more substituents may be the same or different. The letters s and t each independently represent an integer of 0-4.

As examples of compounds represented by general formula (5) above there may be mentioned bisphenol A-based (meth)acrylate compounds such as 2,2-bis(4-((meth)acryloxypolyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes. These may be used as single compounds or as combinations of two or more compounds.

As examples of 2,2-bis(4-((meth)acryloxypolyethoxy)phenyl)propanes there may be mentioned 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane. These may be used as single compounds or as combinations of two or more compounds.

Of these, 2,2-bis(4-(methacryloxypentaethoxy)phenyl)propane is commercially available as BPE-500 (product of Shin-Nakamura Chemical Co., Ltd.), and 2,2-bis(4-(methacryloxypentadecaethoxy)phenyl)propane is commercially available as BPE-1300 (product of Shin-Nakamura Chemical Co., Ltd.). Any of these may be used alone or in combinations of two or more.

As examples of 2,2-bis(4-((meth)acryloxypolypropoxy)phenyl)propanes there may be mentioned 2,2-bis(4-((meth)acryloxydipropoxy)phenyl)propane, 2,2-bis(4-((meth)acryloxytripropoxy)phenyl)propane, 2,2-bis(4-((meth)acryloxytetrapropoxy)phenyl)propane, 2,2-bis(4-((meth)acryloxypentapropoxy)phenyl)propane, 2,2-bis(4-((meth)acryloxyhexapropoxy)phenyl)propane, 2,2-bis(4-((meth)acryloxyheptapropoxy)phenyl)propane, 2,2-bis(4-((meth)acryloxyoctapropoxy)phenyl)propane, 2,2-bis(4-((meth)acryloxynonapropoxy)phenyl)propane, 2,2-bis(4-((meth)acryloxydecapropoxy)phenyl)propane, 2,2-bis(4-((meth)acryloxyundecapropoxy)phenyl)propane, 2,2-bis(4-((meth)acryloxydodecapropoxy)phenyl)propane, 2,2-bis(4-((meth)

acryloxytridecapropoxy)phenyl)propane, 2,2-bis(4-((meth) acryloxytetradecapropoxy)phenyl)propane, 2,2-bis(4-((meth)acryloxypentadecapropoxy)phenyl)propane, 2,2-bis (4-((meth)acryloxyhexadecapropoxy)phenyl)propane and the like. Any of these may be used alone or in combinations of two or more.

As examples of 2,2-bis(4-((meth)acryloxypolyethoxy-polypropoxy)phenyl)propanes there may be mentioned 2,2-bis(4-((meth)acryloxydiethoxyoctapropoxy)phenyl)propane, 2,2-bis(4-((meth)acryloxytetraethoxytetrapropoxy) phenyl)propane, 2,2-bis(4-((meth) acryloxyhexaethoxyhexapropoxy)phenyl)propane and the like. Any of these may be used alone or in combinations of two or more.

Derivatives of the aforementioned bisphenol A-based (meth)acrylate compounds may also be used. As such derivatives there may be mentioned compounds obtained by addition of acrylic acid to the diepoxide group of bisphenol A. VISCOAT #540 (trade name of Osaka Organic Chemical Industry, Ltd.) is a commercially available marketed product. Any of these may be used alone or in combinations of two or more.

As examples of photopolymerizing compounds other than bisphenol A-based (meth)acrylate compounds there may be mentioned compounds obtained by reacting α,β-unsaturated carboxylic acids with polyhydric alcohols, compounds obtained by reacting α,β-unsaturated carboxylic acids with glycidyl group-containing compounds, urethane monomers including urethane bond-containing (meth)acrylate compounds, nonylphenyldioxylene (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, (meth)acrylic acid alkyl esters and EO-modified nonylphenyl (meth)acrylate. These may be used alone or in combinations of two or more. These compounds are preferably used in combination as photopolymerizing compounds.

(Meth)acrylic acids may be mentioned as examples of α,β-unsaturated carboxylic acids.

As examples of glycidyl group-containing compounds there may be mentioned trimethylolpropanetriglycidyl ether tri(meth)acrylate and 2,2-bis(4-(meth)acryloxy-2-hydroxypropyloxy)phenyl. These may be used as single compounds or as combinations of two or more.

As examples of urethane monomers there may be mentioned addition reaction products of (meth)acrylic monomers with an OH group at the P position and diisocyanate compounds such as isophorone diisocyanate, 2,6-toluene diisocyanate, 2,4-toluene diisocyanate and 1,6-hexamethylene diisocyanate, as well as tris((meth)acryloxytetraethyleneglycol isocyanate)hexamethyleneisocyanurate, EO-modified urethane di(meth)acrylate, and EO and PO-modified urethane di(meth)acrylate. "EO" stands for ethylene oxide, and an EO-modified compound has a block structure of ethyleneoxy groups. "PO" stands for propylene oxide, and a PO-modified compound has a block structure of propyleneoxy groups. As an example of an EO-modified urethane di(meth) acrylate there may be mentioned UA-11 by Shin-Nakamura Chemical Co., Ltd. As an example of an EO,PO-modified urethane di(meth)acrylate compound there may be mentioned UA-13 (product of Shin-Nakamura Chemical Co., Ltd.). These may be used as single compounds or as combinations of two or more compounds.

As examples of (meth)acrylic acid alkyl esters there may be mentioned methyl (meth)acrylate, ethyl (meth)acrylate, butyl (meth)acrylate and 2-ethylhexyl (meth)acrylate. These may be used as single compounds or as combinations of two or more compounds.

As examples of compounds obtained by reacting polyhydric alcohols with α,β-unsaturated carboxylic acids there may be mentioned polyethyleneglycol di(meth)acrylates with 2-14 ethylene groups, polypropyleneglycol di(meth) acrylates with 2-14 propylene groups, trimethylolpropane di(meth)acrylate, trimethylolpropane tri(meth)acrylate, trimethylolpropaneethoxy tri(meth)acrylate, trimethylolpropanediethoxy tri(meth)acrylate, trimethylolpropanetriethoxy tri(meth)acrylate, trimethylolpropanetetraethoxy tri(meth) acrylate, trimethylolpropanepentaethoxy tri(meth)acrylate, tetramethylolmethane tri(meth)acrylate, tetramethylolmethane tetra(meth)acrylate, polypropyleneglycol di(meth) acrylates with 2-14 propylene groups, dipentaerythritol penta (meth)acrylate, dipentaerythritol hexa(meth)acrylate and the like. These may be used as single compounds or as combinations of two or more compounds.

The photopolymerization initiator may be any compound that initiates or accelerates photopolymerization of the photopolymerizing compounds. As examples of photopolymerization initiators there may be mentioned aromatic ketones such as 4,4'-bis(diethylamine)benzophenone, benzophenone and 2-benzyl-2-dimethylamino-1-(4-morpholinophenyl)-butanone-1,2-methyl-1-[4-(methylthio)phenyl]-2-morpholinopropanone-1; quinones such as alkylanthraquinone; benzoin compounds such as benzoin and alkylbenzoin; benzoinether compounds such as benzoinalkyl ether; benzyl derivatives such as benzyldimethylketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; acridine derivatives such as 9-phenylacridine and 1,7-bis(9,9'-acridinyl)heptane; and N-phenylglycine, N-phenylglycine derivative and the like. The two aryl-substituted groups of the aforementioned 2,4,5-triarylimidazoles may identical to form a symmetrical compound, or they may be different to form an asymmetrical compound. These photopolymerization initiators may be used alone or in combinations of two or more.

A preferred photopolymerization initiator is 2,4,5-triarylimidazole dimer, from the viewpoint of adhesiveness and sensitivity.

The sensitizing agent allows more effective utilization of the absorption wavelength of the active light rays used. The sensitizing agent is preferably a compound with a maximum absorption wavelength of 370 nm-420 nm. Using such a sensitizing agent according to the invention can provide sufficiently high sensitivity for exposure light in direct writing exposure methods. If the maximum absorption wavelength of the sensitizing agent is less than 370 nm the sensitivity for direct writing exposure light will tend to be reduced, and if it is greater than 420 nm, the stability in yellow light environments will tend to be lower.

As sensitizing agents there may be mentioned thioxanthone-based compounds and compounds represented by the following general formula (1), (2) or (3). These may be used alone or in combinations of two or more.

[Chemical Formula 4]

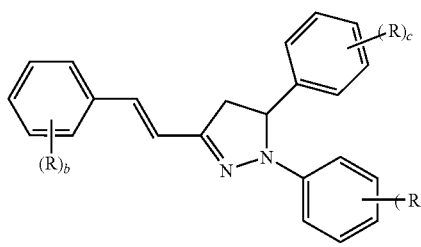

(1)

In formula (1), each R independently represents a C4-12 alkyl group, and a, b and c each independently represent an integer of 0-2 selected so that the total of a, b and c is 1-6. Multiple R groups in the same molecule may be either the same or different. The C4-12 alkyl group may be straight-chain or branched, and it is preferably an n-butyl (hereinafter also referred to as "butyl"), tert-butyl, tert-octyl or dodecyl group.

As specific examples of compounds represented by general formula (1) there may be mentioned 1-(4-tert-butyl-phenyl)-3-styryl-5-phenyl-pyrazoline, 1-phenyl-3-(4-tert-butyl-styryl)-5-(4-tert-butyl-phenyl)-pyrazoline, 1,5-bis-(4-tert-butyl-phenyl)-3-(4-tert-butyl-styryl)-pyrazoline, 1-(4-tert-octyl-phenyl)-3-styryl-5-phenyl-pyrazoline, 1-phenyl-3-(4-tert-octyl-styryl)-5-(4-tert-octyl-phenyl)-pyrazoline, 1,5-bis-(4-tert-octyl-phenyl)-3-(4-tert-octyl-styryl)-pyrazoline, 1-(4-dodecyl-phenyl)-3-styryl-5-phenyl-pyrazoline, 1-phenyl-3-(4-dodecyl-styryl)-5-(4-dodecyl-phenyl)-pyrazoline, 1-(4-dodecyl-phenyl)-3-(4-dodecyl-styryl)-5-(4-dodecyl-phenyl)-pyrazoline, 1-(4-tert-octyl-phenyl)-3-(4-tert-butyl-styryl)-5-(4-tert-butyl-phenyl)-pyrazoline, 1-(4-tert-butyl-phenyl)-3-(4-tert-octyl-styryl)-5-(4-tert-octyl-phenyl)-pyrazoline, 1-(4-dodecyl-phenyl)-3-(4-tert-butyl-styryl)-5-(4-tert-butyl-phenyl)-pyrazoline, 1-(4-tert-butyl-phenyl)-3-(4-dodecyl-styryl)-5-(4-dodecyl-phenyl)-pyrazoline, 1-(4-dodecyl-phenyl)-3-(4-tert-octyl-styryl)-5-(4-tert-octyl-phenyl)-pyrazoline, 1-(4-tert-octyl-phenyl)-3-(4-dodecyl-styryl)-5-(4-dodecyl-phenyl)-pyrazoline, 1-(2,4-di-n-butyl-phenyl)-3-(4-dodecyl-styryl)-5-(4-dodecyl-phenyl)-pyrazoline, 1-phenyl-3-(3,5-di-tert-butyl-styryl)-5-(3,5-di-tert-butyl-phenyl)-pyrazoline, 1-phenyl-3-(2,6-di-tert-butyl-styryl)-5-(2,6-di-tert-butyl-phenyl)-pyrazoline, 1-phenyl-3-(2,5-di-tert-butyl-styryl)-5-(2,5-di-tert-butyl-phenyl)-pyrazoline, 1-phenyl-3-(2,6-di-n-butyl-styryl)-5-(2,6-di-n-butyl-phenyl)-pyrazoline, 1-(3,4-di-tert-butyl-phenyl)-3-styryl-5-phenyl-pyrazoline, 1-(3,5-di-tert-butyl-phenyl)-3-styryl-5-phenyl-pyrazoline, 1-(4-tert-butyl-phenyl)-3-(3,5-di-tert-butyl-styryl)-5-(3,5-di-tert-butyl-phenyl)-pyrazoline and 1-(3,5-di-tert-butyl-phenyl)-3-(3,5-di-tert-butyl-styryl)-5-(3,5-di-tert-butyl-phenyl)-pyrazoline. These may be used alone or in combinations of two or more.

[Chemical Formula 5]

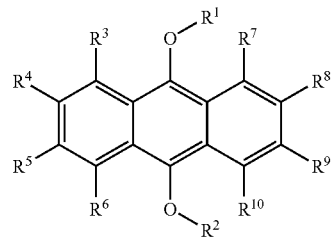

(2)

In general formula (2), $R^1$ and $R^2$ each independently represent C1-20 alkyl, C5-12 cycloalkyl, phenyl, benzyl, C2-12 alkanoyl or benzoyl. $R^3$-$R^{10}$ each independently represent hydrogen, C1-12 alkyl, a halogen atom, cyano, carboxyl, phenyl, C2-6 alkoxycarbonyl or benzoyl.

When the aforementioned C1-20 alkyl group is a C2-12 alkyl group, it may have an oxygen atom between the main chain carbon atoms, and may be substituted with hydroxyl. The C5-12 cycloalkyl group may have an oxygen atom in the ring and may be substituted with hydroxyl. The phenyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups. A benzyl group may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups. The benzoyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl groups.

As preferred examples of $R^1$ and $R^2$ there may be mentioned methyl, ethyl, propyl, butyl, pentyl and hexyl. Examples of combinations of $R^1$ and $R^2$ include a combination of ethyl groups, a combination of propyl groups and a combination of butyl groups.

As preferred examples of $R^3$-$R^{10}$ there may be mentioned hydrogen, methyl, ethyl, propyl, butyl, pentyl, hexyl, propenyl, butenyl, pentenyl, hexenyl, heptenyl, ethoxycarbonyl, hydroxyethoxycarbonyl and phenoxy. Combinations of $R^3$-$R^{10}$ include all hydrogens, a combination of one group as methyl, ethyl, propyl, butyl, pentyl, hexyl, propenyl, butenyl, pentenyl, hexenyl, heptenyl, ethoxycarbonyl, hydroxyethoxycarbonyl or phenoxy and the rest hydrogens; and a combination of two groups as methyl, ethyl, propyl, butyl, pentyl, hexyl, propenyl, butenyl, pentenyl, hexenyl, heptenyl, ethoxycarbonyl, hydroxyethoxycarbonyl or phenoxy, or different combinations thereof, and the rest hydrogens.

As specific examples of compounds represented by general formula (2) there may be mentioned 9,10-dimethoxyanthracene, 9,10-diethoxyanthracene, 9,10-dibutoxyanthracene and 9,10-dimethoxy-2-ethylanthracene. Of such compounds, 9,10-dimethoxyanthracene, 9,10-diethoxyanthracene and 9,10-dibutoxyanthracene are preferred from the viewpoint of further improving the sensitivity of the photosensitive element.

[Chemical Formula 6]

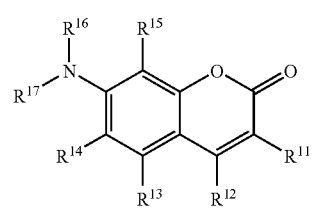

(3)

In formula (3), $R^{16}$ and $R^{17}$ each independently represent hydrogen or a C1-3 alkyl group, $R^{11}$, $R^{12}$, $R^{13}$, $R^{14}$ and $R^{15}$ each independently represent optionally substituted C1-3 alkyl, hydrogen, trifluoromethyl, carboxyl, carboxylic acid ester, hydroxyl or thiol, and $R^{11}$, $R^{12}$, $R^{13}$, $R^{14}$, $R^{15}$, $R^{16}$ and $R^{17}$ may bond together to form a cyclic structure.

As specific examples of compounds represented by general formula (3) there may be mentioned 7-amino-4-methylcoumarin, 7-dimethylamino-4-methylcoumarin, 7-dimethylamino-4-trifluoromethylcoumarin, 7-methylamino-4-methylcoumarin, 7-diethylamino-4-methylcoumarin, 7-ethylamino-4-methylcoumarin, 4,6-dimethyl-7-ethylaminocoumarin, 4,6-dimethyl-7-ethylaminocoumarin, 4,6-dimethyl-7-diethylaminocoumarin, 4,6-dimethyl-7-dimethylaminocoumarin, 4,6-diethyl-7-diethylaminocoumarin, 4,6-diethyl-7-dimethylaminocoumarin, 7-dimethylaminocyclopenta[c]coumarin, 7-aminocyclopenta[c]coumarin, 7-diethylaminocyclopenta[c]coumarin, 2,3,6,7,10,11-hexaanhydro-1H,5H-cyclopenta[3,4][1]benzopyrano[6,7,8-ij]quinolysine 12(9H)-one, 7-diethylamino-5',7'-dimethoxy-3,3'-carbonylbiscoumarin, 3,3'-carbonylbis[7-(diethylamino)coumarin] and 7-diethylamino-3-thienoxylcoumarin. Of such compounds, 7-diethylamino-4-methylcoumarin is particularly preferred from the viewpoint of further improving the sensitivity of the photosensitive element. These may be used as single compounds or as combinations of two or more compounds.

The sensitizing agent is preferably used in combination with 2,4,5-triarylimidazole dimer as a photopolymerization initiator, from the viewpoint of further improving the sensitivity.

The content of the binder polymer is preferably 40-80 parts by weight and more preferably 45-70 parts by weight with respect to 100 parts by weight as the total of the binder polymer and photopolymerizing compound. A content of less than 40 parts by weight will tend to render the photocured composition more brittle, and will tend to result in poor coated film properties when used as a photosensitive element. A content exceeding 80 parts by weight will tend to result in inadequate photosensitivity.

The content of the photopolymerizing compound is preferably 20-60 parts by weight and more preferably 30-60 parts by weight with respect to 100 parts by weight as the total of the binder polymer and photopolymerizing compound. If the content is less than 20 parts by weight the tenting property will tend to be insufficient, and if it is greater than 60 parts by weight the photocured composition will tend to be brittle.

The content of the photopolymerization initiator is preferably 0.5-20 parts by weight, more preferably 1.0-10 parts by weight and even more preferably 1.5-7 parts by weight with respect to 100 parts by weight as the total of the binder polymer and photopolymerizing compound. If the content is less than 0.5 part by weight the photosensitivity will tend to be insufficient, and if it is greater than 20 parts by weight the absorption on the surface of the composition during exposure will increase, tending to result in insufficient photocuring of the interior.

The sensitizing agent content is preferably 0.01-5 parts by weight, more preferably 0.03-3 parts by weight and even more preferably 0.05-2 parts by weight with respect to 100 parts by weight as the total of the binder polymer and photopolymerizing compound. If the content is less than 0.01 parts by weight the photosensitivity will tend to be insufficient, and if it is greater than 5 parts by weight the resolution will tend to be insufficient.

The photosensitive resin composition may, if necessary, also contain dyes such as malachite green, coloring agents such as tribromophenylsulfone, leuco crystal violet or the like, thermal development inhibitors, plasticizers such as p-toluenesulfonamide, pigments, fillers, antifoaming agents, flame retardants, stabilizers, tackifiers, leveling agents, release promoters, antioxidants, aromatics, imaging agents, thermal crosslinking agents and the like. The contents are preferably each about 0.01-20 parts by weight with respect to 100 parts by weight as the total of the binder polymer and photopolymerizing compound. These may be used alone or in combinations of two or more.

Each of the components in the photosensitive resin composition and their contents may be adjusted so as to allow curing by active light rays having a peak in the wavelength range of 390 nm-440 nm. The photosensitive element 1 comprising a photosensitive layer 20 composed of such a photosensitive resin composition allows easy formation of high-density resist patterns by active light rays having a peak in the wavelength range of 390 nm-440 nm.

The thickness of the photosensitive layer 20 may be appropriately set according to the purpose of use, but the post-drying thickness is preferably 1-100 μm and more preferably 1-50 μm, for example. If the thickness is less than 1 μm it will tend to be difficult to achieve coating to the desired thickness, while if it exceeds 100 μm the adhesiveness and resolution of the resist pattern will tend to be lower.

The photosensitive layer 20 preferably has a light transmittance of 5-75%, more preferably 7-60% and most preferably 10-40%, for ultraviolet rays with a wavelength of 365 nm. A transmittance of less than 5% will tend to result in inferior adhesiveness of the resist pattern, while a transmittance of greater than 75% will tend to result in inferior resolution of the resist pattern. The light transmittance may be measured using a UV spectrometer, and the UV spectrometer may be a Model 228A W Beam spectrophotometer by Hitachi, Ltd.

The support 10 may be, for example, a metal plate made of copper, a copper-based alloy, nickel, chromium, iron or an iron-based alloy such as stainless steel (preferably copper, a copper-based alloy or an iron-based alloy), or a polymer film with heat resistance and solvent resistance, such as polyethylene terephthalate, polypropylene, polyethylene or polyester.

The thickness of the support 10 is preferably 5-25 μm, more preferably 8-20 μm and even more preferably 10-16 μm. If the thickness is less than 5 μm the support will tend to tear during release of the support before development, while if it is greater than 25 μm the resolution of the resist pattern will tend to be lower.

The haze of the support 10 is preferably 0.001-5.0, more preferably 0.001-2.0 and even more preferably 0.01-1.8. A haze of greater than 5.0 will tend to lower the resolution of the resist pattern. The haze may be the value measured according to JIS K 7105, and for example, it may be measured using a commercially available turbidimeter such as an NDH-1001 DP (trade name of Nippon Denshoku Industries Co., Ltd.).

The protective film 30 is a film composed mainly of polypropylene, but it is preferably a polypropylene film and more preferably a biaxially oriented polypropylene film. Examples of such polypropylene films that are commercially available include "PP Type PT" (product of Shin-Etsu Film Co., Ltd.), "TORAYFAN YK57" (product of Toray Co., Ltd.) and "ALPHAN E200 SERIES" (product of Oji Paper Co., Ltd.).

The number of fisheyes with diameters of 80 μm or larger in the protective film is preferably no greater than $5/m^2$. Fisheyes are insoluble matter and degradation products that become incorporated into films during their production by heat-fusion, kneading, extrusion, stretching and casting of film materials. The presence and sizes of fisheyes can be confirmed using, for example, an optical microscope, contact surface roughness meter or scanning electron microscope. The diameter (φ) of a fisheye is its maximum diameter.

The fisheyes will usually have diameters of about 10 μm-1 mm and heights of about 1-50 μm from the film surface. By using a film wherein the density of fisheyes with diameters of at least 80 μm is no greater than 5/m², it is possible to more reliably maintain a sufficient level of sensitivity of the photosensitive layer. This will also allow easier and more reliable formation of resist patterns with adequate adhesiveness. If the density of fisheyes exceeds 5/m², the sensitivity of the photosensitive layer and the adhesiveness of the resist pattern will tend to be lower. Such a protective film can be produced by a process wherein, for example, the starting resin is heat-fused during production of the film and then filtered.

The tensile strength in the lengthwise direction of the protective film is preferably at least 13 MPa, more preferably 13-100 MPa, even more preferably 14-100 MPa, yet more preferably 15-100 MPa and most preferably 16-100 MPa. A tensile strength of less than 13 MPa will tend to promote tearing of the protective film during lamination. The tensile strength in the widthwise direction of the film is preferably at least 9 MPa, more preferably 9-100 MPa, even more preferably 10-100 MPa, yet more preferably 11-100 MPa and most preferably 12-100 MPa. A tensile strength of less than 9 MPa will also tend to promote tearing of the protective film during lamination.

The tensile strength may be measured according to JIS C 2318-1997(5.3.3) using, for example, a commercially available tensile strength tester such as a "TENSILON" (trade name of Toyo Baldwin Co., Ltd.).

The protective film preferably has a thickness of 5-50 μm. If the thickness is less than 5 μm the sensitivity of the photosensitive layer and the adhesiveness of the resist pattern will tend to be lower, and the protective film will tend to tear more easily when the protective film is released during use of the photosensitive element. On the other hand, a thickness of greater than 50 μm will tend to increase the cost of the photosensitive element.

The support 10 and protective film 30 may be subjected to surface treatment if necessary. However, the support 10 and protective film 30 must be removable from the photosensitive layer 20 when the photosensitive element 1 is used, and therefore the surface treatment is preferably not to an extent that would hamper their removal.

The support 10 and protective film 30 may also be subjected to antistatic treatment if necessary.

The photosensitive element 1 may be stored as is in the form of a flat sheet, or as a roll wound up on a winding core with a cylindrical or other shape. The winding core is not particularly restricted so long as it is a conventional one, and as examples there may be mentioned plastics such as polyethylene resin, polypropylene resin, polystyrene resin, polyvinyl chloride resin, ABS resin (acrylonitrile-butadiene-styrene copolymer) and the like. Winding for storage is preferably done with the support 10 on the outermost side. From the viewpoint of edge protection, an edge separator is preferably situated at the edge of the photosensitive element 1 (photosensitive element roll) that has been wound up into a roll, and from the viewpoint of preventing edge fusion, the edge separator is preferably moisture-proof. For packaging of the photosensitive element 1, it is preferably bundled with a low moisture permeable black sheet.

The method for fabricating the photosensitive element 1 may be a method in which, for example, the support 10 is coated with a coating solution obtained by dissolving the photosensitive resin composition in a prescribed solvent and then the solvent is removed to form a photosensitive layer 20, and subsequently a protective film 30 is laminated on the photosensitive layer 20.

The solvent used may be a solvent such as methanol, ethanol, acetone, methyl ethyl ketone, methylcellosolve, ethylcellosolve, toluene, N,N-dimethylformamide or propyleneglycol monomethyl ether, or a mixture of such solvents. The coating solution is preferably obtained by dissolving the photosensitive resin composition in the solvent to a solid content of 30-60 wt %.

As examples of coating methods there may be mentioned roll coating, comma coating, gravure coating, air knife coating, die coating, bar coating and the like. The solvent may be removed by heating, for example, in which case the heating temperature is preferably about 70-150° C. and the heating time is preferably about 5-30 minutes.

The method for laminating the protective film 30 on the photosensitive layer 20 may be, for example, a method of pressing with a roll while feeding the polypropylene film onto the photosensitive layer 20.

The resist pattern forming method for this embodiment will now be explained.

The resist pattern forming method of this embodiment comprises a lamination step in which the photosensitive layer is laminated onto a circuit-forming board while releasing the protective film of the photosensitive element from the photosensitive layer, an exposure step in which prescribed sections of the laminated photosensitive layer are irradiated with active light rays, and a developing step in which the photosensitive layer that has been irradiated with active light rays is developed to form a resist pattern. A "circuit-forming board" is a board comprising an insulating layer and a conductive layer formed on the insulating layer.

The method of laminating the photosensitive layer on the circuit-forming board may be a laminating method in which the polypropylene film is first removed and then the photosensitive layer is contact bonded to the circuit-forming board while heating. Lamination under reduced pressure is preferred from the viewpoint of adhesiveness and follow-up property.

The heating temperature for the photosensitive layer is preferably 70-130° C. and the contact bonding pressure is preferably about 0.1-1.0 MPa (about 1-10 kgf/cm²), but there is no particular restriction to these conditions. If the photosensitive layer is heated at 70-130° C. it is not necessary to preheat the circuit-forming board beforehand, but the circuit-forming board may also be preheated for further enhanced laminating properties.

The method for photocuring of the exposed sections by irradiation of prescribed sections of the photosensitive layer with active light rays may be a method in which, for example, the photosensitive layer that has been completely laminated on the circuit-forming board is exposed to active light rays in an image form through a negative or positive mask pattern, known as artwork, and the exposed sections are photocured. When the support on the photosensitive layer is transparent, the active light rays may be irradiated directly, or if the support is non-transparent to the active light rays, the active light rays may be irradiated onto the photosensitive layer after removal of the support.

The light source for the active light rays may be a conventionally known light source such as, for example, a carbon arc lamp, mercury vapor arc lamp, ultra-high-pressure mercury lamp, high-pressure mercury lamp, xenon lamp or the like, which efficiently emits ultraviolet rays. There may also be used a lamp that efficiently emits visible light rays, such as a photoflood lamp or sun lamp.

Instead of mask exposure employing a mask pattern as described above, the exposed sections may be photocured by irradiating prescribed sections of the photosensitive layer with active light rays by direct writing exposure such as laser direct writing exposure or DLP exposure. Direct writing exposure is preferably used for this embodiment from the viewpoint of resolution.

The active light rays used for direct writing exposure are light with a peak in the wavelength range of 390 nm-440 nm. The light source may be a semiconductor laser that emits laser light with a peak in the wavelength range of 390 nm-440 nm. A semiconductor laser is preferably used from the viewpoint of facilitating formation of the resist pattern. Gallium nitride-based blue lasers may be mentioned as such semiconductor lasers.

Alternatively, active light rays obtained as light from a mercury lamp, such as a high-pressure mercury lamp, as the light source and having light with a wavelength of up to 365 nm cut to at least 99.5% may be used as the light with a peak in the wavelength range of 390 nm-440 nm. Examples of filters that may be used to cut light with a wavelength of up to 365 nm include the sharp cut filter "SCF-100S-39 L" (trade name of Sigma Koki Co., Ltd., and the spectroscopic filter "HG0405" (trade name of Asahi Spectra Co., Ltd.).

After exposure, the support is removed from the photosensitive layer and the resist pattern is formed by removing the unexposed sections using wet development or dry development. For wet development, the developing solution used may be an aqueous alkali solution, aqueous developing solution or organic solvent. An aqueous alkali solution is especially preferred from the standpoint of safety and stability, and for more satisfactory manageability.

As examples of bases for the aqueous alkali solution as the developing solution there may be mentioned alkali hydroxides such as hydroxides of lithium, sodium, potassium and the like, alkali carbonates such as carbonates or bicarbonates of lithium, sodium, potassium, ammonium and the like, alkali metal phosphates such as potassium phosphate and sodium phosphate, and alkali metal pyrophosphates such as sodium pyrophosphate and potassium pyrophosphate. The aqueous alkali solution used as the developing solution is preferably a 0.1-5 wt % sodium carbonate dilute solution, a 0.1-5 wt % potassium carbonate dilute solution, a 0.1-5 wt % sodium hydroxide dilute solution or a 0.1-5 wt % sodium tetraborate dilute solution. The pH of the aqueous alkali solution is preferably in the range of 9-11, and the temperature may be adjusted as appropriate for the developing property of the photosensitive layer. The aqueous alkali solution may also contain added surfactants, antifoaming agents, and small amounts of organic solvent to accelerate development.

Aqueous developing solutions composed of water and an aqueous alkali solution or one or more different organic solvents may also be mentioned. As examples of bases for aqueous alkali solutions other than those already referred to above there may be mentioned borax, or sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine and the like. As examples of organic solvents there may be mentioned triacetone alcohol, acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether, diethyleneglycol monobutyl ether and the like. These may be used alone or in combinations of two or more.

The concentration of the organic solvent in the aqueous developing solution is preferably 2-90 wt %, and the temperature may be adjusted as appropriate for the developing property of the photosensitive layer. The pH of the aqueous developing solution is preferably as low as possible in a range allowing sufficient development of the resist, and more specifically it is preferably pH 8-12 and more preferably pH 9-10. The aqueous developing solution may also contain a small amount of a surfactant, antifoaming agent or the like.

As examples of organic solvent-based developing solutions there may be mentioned 1,1,1-trichloroethane, N-methylpyrrolidone, N,N-dimethylformamide, cyclohexanone, methyl isobutyl ketone and γ-butyrolactone. Water is preferably added to these organic solvents in a range of 1-20 wt % for anti-flammability.

A developing method employing a combination of two or more of the different developing systems mentioned above may also be carried out if necessary for this embodiment. The developing system may be a dip system, paddle system, spray system, brushing, slapping or the like, but a high-pressure spray system is most suitable for improved resolution.

Post-development treatment may consist of heating at about 60-250° C. or exposure at about 0.2-10 mJ/cm$^2$ if necessary for further curing of the resist pattern.

The printed circuit board production process for this embodiment will now be explained.

The printed circuit board production process for this embodiment comprises a lamination step in which the photosensitive layer is laminated onto a circuit-forming board while releasing the protective film of the photosensitive element from the photosensitive layer, an exposure step in which prescribed sections of the laminated photosensitive layer are irradiated with active light rays, a developing step in which the photosensitive layer that has been irradiated with active light rays is developed to form a resist pattern, and a conductor pattern-forming step in which a conductor pattern is formed by etching or plating the circuit-forming board on which the resist pattern has been formed. The lamination step, exposure step and developing step may be performed in the same manner as in the resist pattern forming method.

The etching or plating of the circuit-forming board is carried out on the conductive layer of the circuit-forming board using the formed resist pattern as a mask. The etching solution used for etching may be, for example, a cupric chloride solution, ferric chloride solution, alkali etching solution or hydrogen peroxide-based etching solution. A ferric chloride solution is preferred from the viewpoint of achieving a satisfactory etch factor. The plating process used for plating may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating.

After completion of the etching or plating, the resist pattern is released, for example, with an aqueous solution of even stronger alkalinity than the aqueous alkali solution used for development. The strongly alkaline aqueous solution used here may be, for example, a 1-10 wt % sodium hydroxide aqueous solution or a 1-10 wt % potassium hydroxide aqueous solution. The releasing system may be, for example, a dipping system, spraying system or the like. These may be carried out alone or in combination.

A printed circuit board is obtained in this manner, and the printed circuit board production process of this embodiment can be applied for fabrication not only of monolayer printed circuit boards but also multilayer printed circuit boards.

The embodiments described above are preferred embodiments of the invention, but the invention is not limited thereto.

EXAMPLES

The present invention will now be explained in greater detail through the following examples, with the understanding that these examples are in no way limitative on the invention.

Examples 1-5 and Comparative Examples 1-4

First, the components listed in Table 1 were combined in the amounts (g) shown in the same table to obtain solution S.

TABLE 1

| Solution S | | Content (g) |
|---|---|---|
| Binder polymer | Methacrylic acid/methyl methacrylate/styrene (wt. ratio: 25/50/25, wt. av. mol. wt.: 55,000, 2-methoxyethanol/toluene solution solid dispersion value: 163.1 mgKOH/g) | 113 (solid content: 54) |
| Photopolymerizable compound | Bisphenol A-backbone EO-modified dimethacrylate*[1] | 46 |
| Photopolymerization initiator | 2,2'-bis(o-Chlorophenyl)-4,4',5,5'-tetraphenyl-1,2'-biimidazole | 3.7 |
| Coloring agent | Leuco crystal violet | 0.3 |
| Dye | Malachite green | 0.03 |
| Solvent | Acetone | 10 |
| | Toluene | 7 |
| | N,N'-Dimethylformamide | 3 |
| | Methanol | 3 |

*[1]EO-modified bisphenol A dimethacrylate represented by the following general formula (6) ("FA-321 M", product of Hitachi Chemical Co., Ltd.). In general formula (6), m + n = 10 (mean value).

*1: EO-modified bisphenol A dimethacrylate represented by the following general formula (6) ("FA-321 M", product of Hitachi Chemical Co., Ltd.). In general formula (6), m+n=10 (mean value).

[Chemical Formula 7]

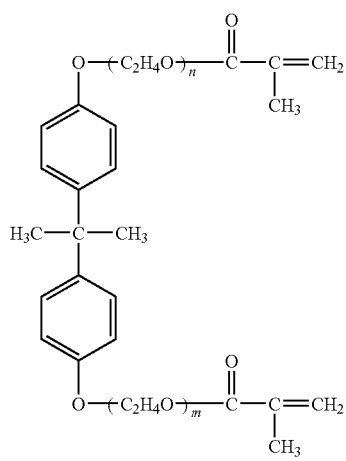

(6)

The sensitizing agents NF-EO, DBA, Cl and EAB were dissolved in solution S shown in Table 1 in the amounts (g) shown in Table 2 to obtain solutions of photosensitive resin compositions A, B, C and D. NF-EO, DBA, Cl and EAB are the following compounds.

NF-EO: 1-Phenyl-3-(4-tert-butyl-styryl)-5-(4-tert-butyl-phenyl)-pyrazoline ("NF-EO", trade name of Nippon Chemical Industrial Co., Ltd., maximum absorption wavelength $[\lambda_{max}]$=387 nm)

DBA: 9,10-Dibutoxyanthracene (product of Kawasaki Kasei Chemicals, Ltd., absorption maxima wavelengths $[\lambda_n]$=368 nm, 388 nm, 410 nm)

Cl: 7-Diethylamino-4-methylcoumarin (product of Nippon Chemical Industrial Co., Ltd., maximum absorption wavelength $[\lambda_{max}]$=374 nm)

EAB: 4,4'-Bis(diethylamino)benzophenone (product of Hodogaya Chemical Co., Ltd., maximum absorption wavelength $[\lambda_{max}]$=365 nm)

TABLE 2

| | Photosensitive resin composition | | | |
|---|---|---|---|---|
| | A | B | C | D |
| NF-EO | 0.35 | 0 | 0 | 0 |
| DBA | 0 | 0.35 | 0 | 0 |
| Cl | 0 | 0 | 0.35 | 0 |
| EAB | 0 | 0 | 0 | 0.35 |

Example 1

The obtained photosensitive resin composition A was evenly coated onto a 16 μm-thick polyethylene terephthalate film ("GS-16", trade name of Teijin, Ltd., haze: 1.7%). Next, a hot air convection drier was used for drying at 100° C. for 10 minutes to form a photosensitive layer with a 20 μm post-drying thickness. A protective film was then laminated on the photosensitive layer by roll pressing to obtain a photosensitive element for Example 1. The protective film used was a polypropylene film (film thickness: 20 μm, tensile strength of film in lengthwise direction: ≧15 MPa, tensile strength of film in widthwise direction: ≧10 MPa, "E-200C", trade name of Oji Paper Co., Ltd.). The density of fisheyes with diameters of 80 μm or larger in the polypropylene film was no greater than 5/m².

Example 2

A photosensitive element for Example 2 was obtained in the same manner as Example 1, except that photosensitive resin composition B was used instead of photosensitive resin composition A.

Example 3

A photosensitive element for Example 3 was obtained in the same manner as Example 1, except that photosensitive resin composition C was used instead of photosensitive resin composition A.

Example 4

A photosensitive element for Example 4 was obtained in the same manner as Example 1, except that the protective film was the polypropylene film YK57 (film thickness: 15 μm, "YK57", trade name of Toray Co., Ltd.) instead of the polypropylene film E-200C. The density of fisheyes with diameters of 80 μm or larger in the polypropylene film was no greater than 5/m².

Example 5

A photosensitive element for Example 5 was obtained in the same manner as Example 2, except that the protective film was the polypropylene film YK57 (film thickness: 15 μm, "YK57", trade name of Toray Co., Ltd.) instead of the polypropylene film E-200C. The density of fisheyes with diameters of 80 μm or larger in the polypropylene film was no greater than 5/m².

Comparative Example 1

A photosensitive element for Comparative Example 1 was obtained in the same manner as Example 1, except that the protective film was a polyethylene film (film thickness: 22 μm, tensile strength of film in lengthwise direction: 16 MPa, tensile strength of film in widthwise direction: 12 MPa, "NF-15", trade name of Tamapoly Co., Ltd.) instead of the polypropylene film E-200C. The density of fisheyes with diameters of 80 μm or larger in the polyethylene film was 10/m².

Comparative Example 2

A photosensitive element for Comparative Example 1 was obtained in the same manner as Example 2, except that the protective film was a polyethylene film (film thickness: 22 μm, tensile strength of film in lengthwise direction: 16 MPa, tensile strength of film in widthwise direction: 12 MPa, "NF-15", trade name of Tamapoly Co., Ltd.) instead of the polypropylene film E-200C. The density of fisheyes with diameters of 80 μm or larger in the polyethylene film was 10/m².

Comparative Example 3

A photosensitive element for Comparative Example 3 was obtained in the same manner as Example 1, except that photosensitive resin composition D was used instead of photosensitive resin composition A.

Comparative Example 4

A photosensitive element for Comparative Example 4 was obtained in the same manner as Example 1, except that solution S was used instead of photosensitive resin composition A.

Each of the obtained photosensitive elements was used for lamination of a photosensitive layer on a copper clad laminate by the following method to obtain a laminated body. Specifically, the copper surface of a copper clad laminate ("MCL-E-67" by Hitachi Chemical Co., Ltd.) comprising a glass epoxy agent laminated on both sides of a copper foil (35 mm thickness) was polished using a polishing machine with a #600-equivalent brush (Sankei Co., Ltd.), and after cleaning with water, it was dried with an air stream. The obtained copper clad laminate was heated to 80° C., and the photosensitive layer was laminated on the copper clad laminate at 120° C. under a pressure of 0.4 MPa while peeling off the protective film of the photosensitive element from the photosensitive layer, to obtain a laminated body.

<Photosensitivity and Resolution Test>

The laminate was cooled to 23° C., and the surface of the polyethylene terephthalate film positioned on the outermost layer of the laminated body was laminated with a phototool having a density region of 0.00-2.00, a density step of 0.05 and a 41-step tablet with a tablet (rectangle) size of 20 mm×187 mm and a step (rectangle) size of 3 mm×12 mm, and a phototool having a wiring pattern with a line width/space width of 6/6-35/35 (units: mm) as a resolution evaluation negative, in that order. A sharp cut filter SCF-100S-39 L (trade name) by Sigma Koki Co., Ltd. that cuts at least 99.5% of light with a wavelength of up to 365 nm was situated thereover.

A parallel light exposure system ("EXM-1201" by Orc Manufacturing Co., Ltd.) with a 5 kW short arc lamp as the source was used for exposure at an exposure dose which left 17 steps after development of the 41-step tablet, and the exposure dose was recorded as the sensitivity. The illuminance measurement was conducted for light passing through the sharp cut filter using an ultraviolet illuminometer ("UIT-101", product of Ushio Inc.) with a 405 nm probe, and the product of the illuminance and exposure time was recorded as the exposure dose. The results are shown in Table 3.

The polyethylene terephthalate film was then released, and 1 wt % aqueous sodium carbonate at 30° C. was sprayed for 24 seconds to remove the unexposed sections. The resolution was evaluated as the smallest value of the space width between line widths which allowed clean removal of the unexposed sections by developing treatment and produced lines without or waviness or breaking. Small values are desirable for the sensitivity and resolution evaluation. The results are shown in Table 3.

TABLE 3

|  | Examples | | | | | Comparative Examples | | | |
| --- | --- | --- | --- | --- | --- | --- | --- | --- | --- |
|  | 1 | 2 | 3 | 4 | 5 | 1 | 2 | 3 | 4 |
| Photosensitive resin composition | A | B | C | A | B | A | B | D | Solution S |
| Protective film | E-200C | E-200C | E-200C | YK 57 | YK 57 | NF-15 | NF-15 | E-200C | E-200C |
| Exposure dose (mJ/cm²) | 20 | 20 | 20 | 20 | 20 | 60 | 60 | 100 | 100 |
| Resolution (μm) | 20 | 20 | 20 | 20 | 20 | 20 | 20 | 20 | 20 |

INDUSTRIAL APPLICABILITY

According to the invention it is possible to provide a photosensitive element with sufficiently high sensitivity without impairing resolution or adhesiveness, even with the exposure light of direct writing exposure methods.

The invention claimed is:

1. A photosensitive element comprising a support, a photosensitive layer and a protective film laminated in that order, wherein the photosensitive layer is composed of a photosensitive resin composition containing a binder polymer, a photopolymerizing compound, a photopolymerization initiator, and in addition thereto at least one sensitizing agent selected from the group of compounds represented by the following general formulas (1) and (2),
the photopolymerization initiator is 2,4,5-triarylimidazole dimer,
the binder polymer contains styrene or a styrene derivative, the protective film is composed mainly of polypropylene,
the protective film has a property of inhibiting permeation of oxygen into the photosensitive layer, and
the photosensitive element has a property of forming a resist pattern by exposure to light with a peak in the wavelength range of 390 nm-440 nm;

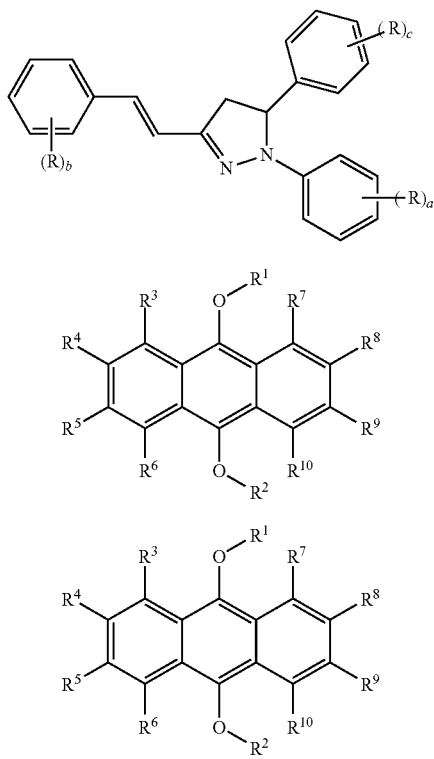

[In formula (1), each R independently represents a C4-12 alkyl group, and a, b and c each independently represent an integer of 0-2 selected so that the total of a, b and c is 1-6;
In formula (2), $R^1$ and $R^2$ each independently represent a C1-20 alkyl, C5-12 cycloalkyl, phenyl, benzyl, C2-12 alkanoyl or benzoyl group, and $R^3$, $R^4$, $R^5$, $R^6$, $R^7$, $R^8$, $R^9$ and $R^{10}$ each independently represent hydrogen, C1-12 alkyl, a halogen atom, cyano, carboxyl, phenyl, C2-6 alkoxycarbonyl or benzoyl. When the aforementioned C1-20 alkyl group is a C2-12 alkyl group, it may have an oxygen atom between the main chain carbon atoms, and may be substituted with hydroxyl. The C5-12 cycloalkyl group may have an oxygen atom in the ring and may be substituted with hydroxyl. The phenyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. A benzyl group may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. The benzoyl group in $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl].

2. A photosensitive element according to claim 1, wherein each R is independently selected from the group consisting of n-butyl, tert-butyl, tert-octyl and dodecyl groups.

3. A photosensitive element according to claim 1, wherein the compound represented by general formula (1) is 1-phenyl-3-(4-t-butylstyryl)-5-(4-t-butylphenyl)-pyrazoline.

4. A photosensitive element according to claim 1, wherein $R^1$ and $R^2$ each independently represent a C1-4 alkyl group, and $R^3$, $R^4$, $R^5$, $R^6$, $R^7$, $R^8$, $R^9$ and $R^{10}$ are hydrogen.

5. A photosensitive element according to claim 1, wherein the compound represented by general formula (2) is 9,10-dibutoxyanthracene.

6. A photosensitive element according to claim 1, wherein the density of fisheyes with diameters of 80 μm or larger in the protective film is no greater than 5/m².

7. A photosensitive element according to claim 1, wherein the thickness of the protective film is 5-50 μm.

8. A resist pattern forming method comprising
a lamination step in which the protective film of a photosensitive element according to claim 1 is released from the photosensitive layer while laminating the photosensitive layer onto a circuit-forming board,
an exposure step in which prescribed sections of the laminated photosensitive layer are irradiated with active light rays by a direct writing exposure method, and
a developing step in which the photosensitive layer that has been irradiated with active light rays is developed to form a resist pattern.

9. A printed circuit board production process comprising
a lamination step in which the protective film of a photosensitive element according to claim 1 is released from the photosensitive layer while laminating the photosensitive layer onto a circuit-forming board,
an exposure step in which prescribed sections of the laminated photosensitive layer are irradiated with active light rays by a direct writing exposure method,
a developing step in which the photosensitive layer that has been irradiated with active light rays is developed to form a resist pattern, and
a conductor pattern-forming step in which a conductor pattern is formed by etching or plating the circuit-forming board on which the resist pattern has been formed.

10. A photosensitive element according to claim 1, wherein the compound represented by the general formula (1) is 1-phenyl-3-(4-tert-butyl-styryl)-5-(4-tert-butyl-phenyl)-pyrazoline, and the compound represented by the general formula (2) is 9,10-dibutoxyanthracene.

* * * * *